United States Patent
Hasegawa et al.

(10) Patent No.: US 11,756,768 B2
(45) Date of Patent: Sep. 12, 2023

(54) HIGH-FREQUENCY POWER SUPPLY SYSTEM

(71) Applicant: DAIHEN CORPORATION, Osaka (JP)

(72) Inventors: Yuichi Hasegawa, Osaka (JP); Yuya Ueno, Osaka (JP)

(73) Assignee: DAIHEN CORPORATION, Osaka (JP)

( * ) Notice: Subject to any disclaimer, the term of this patent is extended or adjusted under 35 U.S.C. 154(b) by 117 days.

(21) Appl. No.: 17/554,609

(22) Filed: Dec. 17, 2021

(65) Prior Publication Data

US 2022/0208519 A1 Jun. 30, 2022

(30) Foreign Application Priority Data

Dec. 25, 2020 (JP) ................................ 2020-217562

(51) Int. Cl.
*H01J 37/32* (2006.01)

(52) U.S. Cl.
CPC .. *H01J 37/32155* (2013.01); *H01J 37/32183* (2013.01)

(58) Field of Classification Search
CPC ..................... H01J 37/32155; H01J 37/32183
See application file for complete search history.

(56) References Cited

U.S. PATENT DOCUMENTS

| | | | |
|---|---|---|---|
| 9,030,101 B2 | 5/2015 | Valcore, Jr. et al. | |
| 9,114,666 B2 | 8/2015 | Valcore, Jr. et al. | |
| 9,171,699 B2 | 10/2015 | Valcore, Jr. et al. | |
| 9,197,196 B2 | 11/2015 | Valcore, Jr. et al. | |
| 9,236,228 B2 | 1/2016 | Valcore, Jr. et al. | |
| 9,295,148 B2 | 3/2016 | Fong et al. | |
| 9,320,126 B2 | 4/2016 | Valcore, Jr. et al. | |
| 9,337,000 B2 | 5/2016 | Marakhtanov et al. | |
| 9,368,329 B2 | 6/2016 | Valcore, Jr. et al. | |
| 9,390,893 B2 | 7/2016 | Valcore, Jr. et al. | |
| 9,401,264 B2 | 7/2016 | Marakhtanov et al. | |

(Continued)

FOREIGN PATENT DOCUMENTS

| | | |
|---|---|---|
| JP | H07-74159 A | 3/1995 |
| JP | 2017-188434 A | 10/2017 |
| JP | 2018-536295 A | 12/2018 |

*Primary Examiner* — Henry Luong
(74) *Attorney, Agent, or Firm* — Crowell & Moring LLP

(57) ABSTRACT

Proposed are techniques for simplifying the process of suppressing an increase in a reflected wave Pr due to IMD. A high-frequency power supply system for providing high-frequency power to a load includes: a bias power supply for supplying a bias power having a first frequency; a source power supply for supplying a high-frequency output having a second frequency higher than the first frequency and being frequency modulated with the first frequency; and a matching device including an impedance matching circuit for acquiring the bias power and the frequency modulated high-frequency output and achieving impedance matching between the source power supply and the load. The source power supply, in response to a trigger signal for timing having the first frequency, detects a reflected wave while causing a modulation start phase and a modulation amount gain to be varied, and determines an optimum modulation start phase and modulation amount gain that minimize the reflected wave.

6 Claims, 5 Drawing Sheets

(56) References Cited

U.S. PATENT DOCUMENTS

| | | |
|---|---|---|
| 9,462,672 B2 | 10/2016 | Valcore, Jr. et al. |
| 9,502,216 B2 | 11/2016 | Valcore, Jr. et al. |
| 9,530,620 B2 | 12/2016 | Valcore, Jr. |
| 9,607,810 B2 | 3/2017 | Valcore, Jr. et al. |
| 9,620,334 B2 | 4/2017 | Lyndaker et al. |
| 9,620,337 B2 | 4/2017 | Valcore, Jr. et al. |
| 9,711,332 B2 | 7/2017 | Howald et al. |
| 9,720,022 B2 | 8/2017 | Howald et al. |
| 9,779,196 B2 | 10/2017 | Valcore, Jr. et al. |
| 9,812,294 B2 | 11/2017 | Valcore, Jr. et al. |
| 9,831,065 B2 | 11/2017 | Fong et al. |
| 9,831,071 B2 | 11/2017 | Howald et al. |
| 9,837,252 B2 | 12/2017 | Howald et al. |
| 9,842,725 B2 | 12/2017 | Valcore, Jr. et al. |
| 9,947,514 B2 | 4/2018 | Radomski et al. |
| 9,960,015 B2 | 5/2018 | Valcore, Jr. et al. |
| 9,997,333 B2 | 6/2018 | Valcore, Jr. et al. |
| 10,304,669 B1 | 5/2019 | Coumou et al. |
| 2009/0159211 A1* | 6/2009 | Usui ............... H01J 37/32935 156/345.24 |
| 2014/0305589 A1 | 10/2014 | Valcore, Jr. |
| 2015/0069912 A1 | 3/2015 | Valcore, Jr. et al. |
| 2015/0311041 A1 | 10/2015 | Valcore, Jr. et al. |
| 2016/0044775 A1 | 2/2016 | Valcore, Jr. et al. |
| 2016/0189937 A1 | 6/2016 | Valcore, Jr. et al. |
| 2016/0233058 A1 | 8/2016 | Marakhtanov et al. |
| 2016/0002681 A1 | 9/2016 | Valcore, Jr. et al. |
| 2016/0259872 A1 | 9/2016 | Howald et al. |
| 2016/0268100 A1 | 9/2016 | Valcore, Jr. et al. |
| 2016/0307736 A1 | 10/2016 | Howald et al. |
| 2016/0307738 A1 | 10/2016 | Marakhtanov et al. |
| 2016/0308560 A1 | 10/2016 | Howald et al. |
| 2016/0336152 A1 | 11/2016 | Valcore, Jr. et al. |
| 2017/0032945 A1 | 2/2017 | Valcore, Jr. et al. |
| 2017/0062187 A1 | 3/2017 | Radomski et al. |
| 2017/0084432 A1 | 3/2017 | Valcore, Jr. et al. |
| 2017/0178873 A1 | 6/2017 | Valcore, Jr. et al. |
| 2017/0194130 A1 | 7/2017 | Lyndaker et al. |
| 2017/0294293 A1 | 10/2017 | Howald et al. |
| 2017/0330732 A1 | 11/2017 | Valcore, Jr. et al. |
| 2018/0018418 A1 | 1/2018 | Valcore, Jr. et al. |
| 2018/0053632 A1 | 2/2018 | Fong et al. |
| 2018/0068834 A1 | 3/2018 | Valcore, Jr. et al. |
| 2018/0294140 A1 | 10/2018 | Valcore, Jr. et al. |
| 2018/0323038 A1 | 11/2018 | Valcore, Jr. et al. |
| 2019/0057847 A1 | 2/2019 | Valcore, Jr. et al. |
| 2019/0272306 A1 | 9/2019 | Howald et al. |
| 2019/0318919 A1 | 10/2019 | Lyndaker et al. |
| 2020/0067545 A1 | 2/2020 | Howald et al. |
| 2020/0074034 A1 | 3/2020 | Valcore, Jr. et al. |
| 2020/0218774 A1 | 7/2020 | Howald et al. |
| 2020/0243304 A1 | 7/2020 | Valcore, Jr. et al. |

* cited by examiner

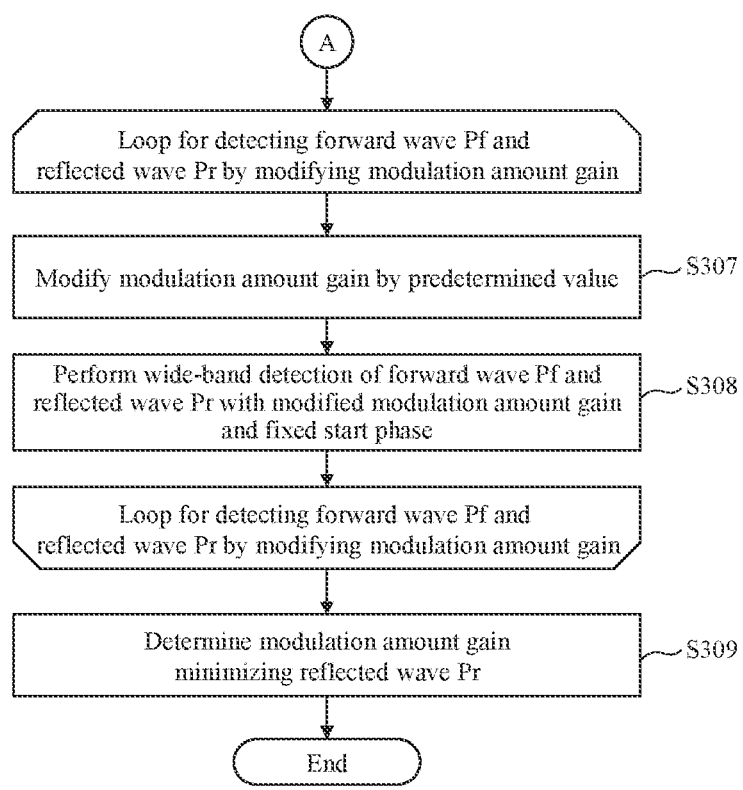

| Detected waveform Pf | | | | | |
|---|---|---|---|---|---|
| Detected waveform Pr | | | | | |
| Control and signal processing | Compute reflection coefficient | DDS setting | Compute reflection coefficient | DDS setting | Compute reflection coefficient |
| | Modify modulation start phase until reflection coefficient becomes minimum value | | Modify modulation amount gain until reflection coefficient becomes minimum value | | |
| Modulation setting | Reflection coefficient vs Modulation start phase θ (Sweep) | | Reflection coefficient vs Modulation amount gain A (Sweep) | | Modulation start phase =θ(Γmin) Modulation amount gain =A(Γmin) |
| Frequency setting | Set frequency at specified phase | Repeat | Set frequency at specified modulation level | Repeat | Matching completed |

FIG. 4A  FIG. 4B  FIG. 4C

HIGH-FREQUENCY POWER SUPPLY SYSTEM

RELATED APPLICATIONS

The present application claims priority from Japanese Patent Application No. JP 2020-217562 filed on Dec. 25, 2020, the content of which is hereby incorporated by reference into this application.

BACKGROUND OF THE INVENTION

1. Field of the Invention

The present disclosure relates to a high-frequency power supply system.

2. Description of the Related Art

In the field of semiconductor manufacturing, higher-density mounting is required as electronic equipment has become smaller in size and more enhanced in functionality. Thus, connections of elements onto a mounting substrate have become smaller, making it necessary to perform mounting with greater reliability.

One of the methods for ensuring the reliability of such mounting is a surface reforming method using a plasma. For example, when plasma processing is performed on a substrate to be processed, it is possible to remove contamination due to organic material attached to the surface of the substrate. As a result, the bonding strength of wire bonding can be increased, wettability can be improved, and adhesion between the substrate and sealing resin can be increased. To perform such plasma processing, it is necessary to connect a power supply device to a plasma reactor device.

For example, JP H07-74159 A discloses a configuration example of a power supply device connected to a plasma reactor device. Specifically, JP H07-74159 A discloses a configuration in which a high-frequency (source) power supply and a low-frequency (bias) power supply are superimposed via a matching circuit to supply power to the plasma reactor device. The matching circuit performs impedance matching between the power supply side and the plasma reactor device side to achieve efficient supply of power.

SUMMARY OF THE INVENTION

When a dual-frequency power supply is provided as discussed in JP H07-74159 A, it is known that a plasma sheath is generated together with a plasma in the plasma chamber of the plasma reactor device. Generally, the plasma sheath may be considered to be electrically insulated, and it may be considered that a virtual capacitor is formed between the electrodes of the plasma chamber. Because the position of the plasma varies in conjunction with a periodic change in the voltage of the low-frequency (bias) power supply, the capacitance of the plasma sheath also varies periodically (for example, with the same period as or twice the period of the bias frequency, depending on the structure of the plasma chamber). This means that the plasma impedance varies at high speed due to a change in the voltage of the bias power supply.

However, because an impedance variable element of a matching device is typically operated by a motor, the matching operation may not be able to follow the fast change in plasma impedance. As a result, the amount of reflected wave Pr that feeds back to the output end of the source power supply may increase due to inter-modulation distortion (IMD). An increase in the reflected wave may prevent efficient and accurate supply of power to the load side. Thus, the IMD needs to be reduced.

In this respect, JP 2018-536295 A, JP 2017-188434 A, and U.S. Pat. No. 10,304,669 disclose techniques wherein, in a period of a low-frequency side power supply (LF), a phase (frequency) and power of a high-frequency power supply (HF) such that the reflected wave can be reduced are determined based on an impedance computed in a high-speed and divided manner and a frequency/matching section look-up table, and the HF is controlled to operate in accordance with a "trigger signal" from the LF.

However, according to the techniques disclosed in JP H07-74159 A, JP 2018-536295 A, and JP 2017-188434 A, much processing needs to be performed at high speed within one period (for example, 400 kHz) of the low-frequency side power supply (LF). Thus, a large burden is placed on the high-frequency power supply side.

In view of the foregoing, embodiments of the present disclosure propose techniques for simplifying the process of suppressing an increase in reflected wave Pr (which is synonymous with a reflection coefficient) due to IMD.

An embodiment of the present disclosure provides a high-frequency power supply system for providing a high-frequency power to a connected load. The high-frequency power supply system includes: a bias power supply for supplying a bias power at a first frequency; a source power supply for supplying a high-frequency output of a second frequency higher than the first frequency, the high-frequency output being frequency modulated with the first frequency; and a matching device including an impedance matching circuit for acquiring the bias power and the frequency modulated high-frequency output and achieving matching between an impedance on the source power supply side and an impedance on the load side. The source power supply, in response to a trigger signal for timing having the same frequency as the first frequency, detects a reflected wave while causing each of a modulation start phase and a modulation amount gain to be varied, and determines an optimum modulation start phase and an optimum modulation amount gain that minimize the reflected wave.

Additional features of the present disclosure will become apparent from a consideration of the ensuing description and attached drawings. Aspects of the present disclosure may be achieved and implemented by various elements, various combinations of elements, and the following detailed description and aspects set forth in the appended claims.

It is to be understood that the discussions provided herein are merely exemplary and are not intended in any way to be restrictive of the scope of the claims or application examples.

According to the techniques of the present disclosure, it is possible to simplify (i.e., to reduce the number of processing operations for) the process of suppressing an increase in a reflected wave Pr due to IMD.

BRIEF DESCRIPTION OF THE DRAWINGS

FIG. 3B is a flowchart (latter half) for describing the matching process in the source power supply 10 according to the present embodiment; and FIGS. 4A, 4B and 4C illustrate changes in a forward wave Pf and a reflected wave Pr from the start of a modulating

DETAILED DESCRIPTION OF THE PREFERRED EMBODIMENTS

In the following, an embodiment of the present disclosure will be described with reference to the attached drawings, wherein functionally similar elements may be designated with like numerals. While the attached drawings may illustrate specific embodiments and implementation examples in accordance with the principles of the present disclosure, these are presented to aid an understanding of the present disclosure and are not to be taken in a limiting sense.

While the embodiment is described in sufficient detail to enable those skilled in the art to practice the present disclosure, it is to be understood that other implementations or modes are also possible, and that changes in configuration or structure and substitutions of various elements may be made without departing from the scope and spirit of the present disclosure. Thus, the following descriptions should not be construed in a limiting manner.

Further, embodiments of the present disclosure may be implemented in software running on a general-purpose computer, in dedicated hardware, or in a combination of hardware and software.

<Configuration Example of Power Supply Providing System>

Figure 1:
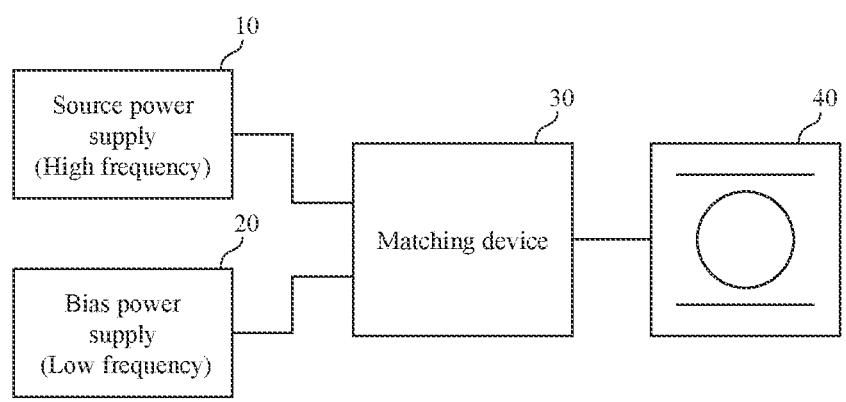
FIG. 1 illustrates a state in which a plasma load 40 is connected to a power supply providing system (also referred to as a high-frequency power supply system) 1 according to an embodiment.

FIG. 1 illustrates a state in which a plasma load 40 is connected to a power supply providing system (also referred to as a high-frequency power supply system) 1 according to the present embodiment. The power supply providing system 1 includes a source power supply (for supplying a high-frequency output) 10, a bias power supply (for supplying a low-frequency output) 20, and a matching device (also referred to as an impedance conversion device) 30 to which an output is supplied from each of the source power supply 10 and the bias power supply 20, and which provides impedance matching between the side of the source power supply 10 and the bias power supply 20 and the side of the plasma load 40. The power supply providing system 1 provides the plasma load 40 with a forward wave (source power) output from the source power supply 10 and a forward wave (bias power) output from the bias power supply 20 in a superimposed manner, for example.

<Inner Configuration Example of Source Power Supply 10>

Figure 2:
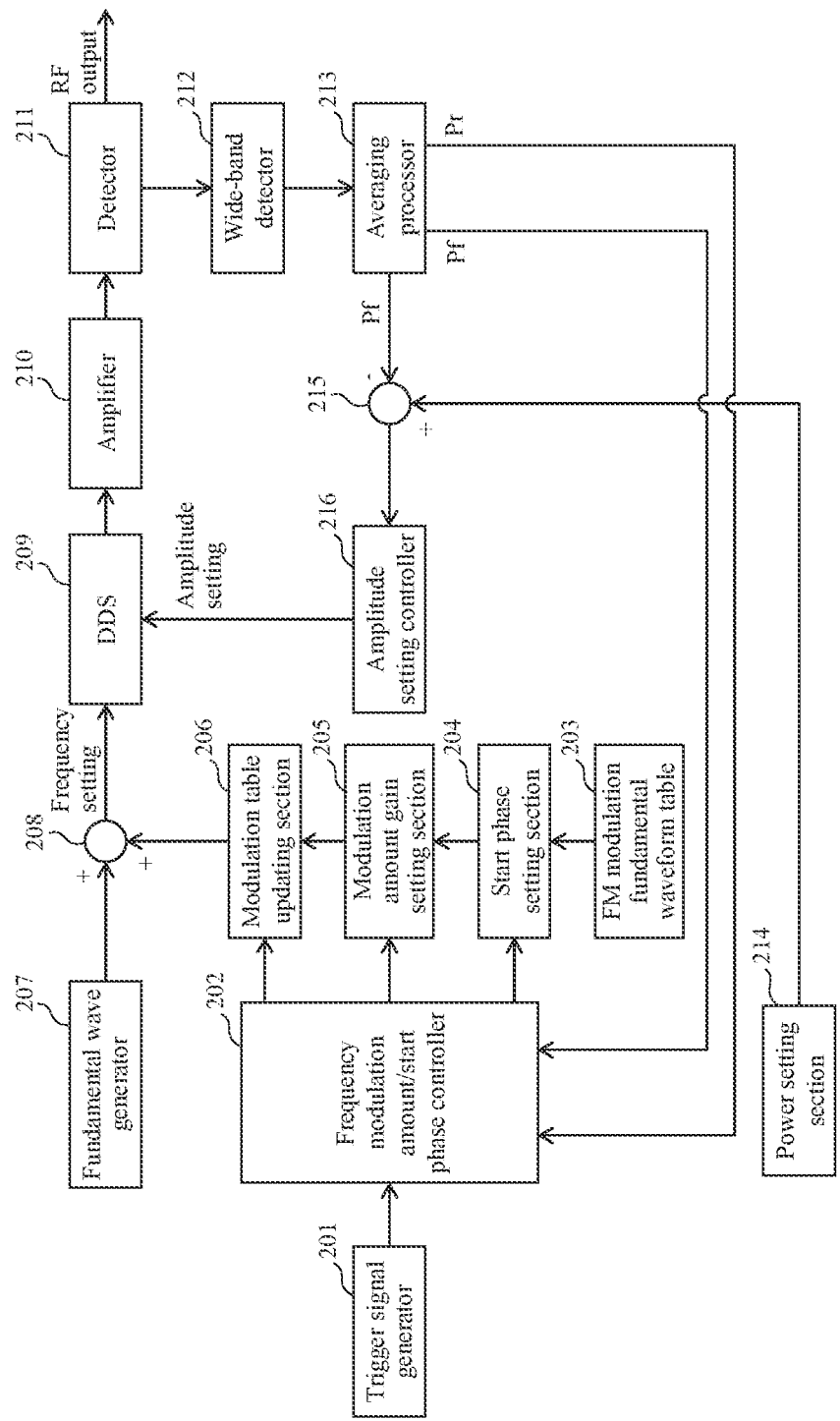
FIG. 2 illustrates an internal configuration example of a source power supply 10 according to the present embodiment.

FIG. 2 illustrates an inner configuration example of the source power supply 10 of the present embodiment. As illustrated in FIG. 2, the source power supply 10 includes: a trigger signal generator 201; a frequency modulation amount/start phase controller 202; an FM-modulated fundamental waveform table 203; a start phase setting section 204; a modulation amount gain setting section 205; a modulation table updating section 206; a fundamental wave generator 207; a summing section (modulator) 208; a digital direct synthesizer (DDS) 209; an amplifier 210; a detector 211; a wide-band detector 212; an averaging processor 213; an amplitude setting controller 216; a power setting section 214; and a subtractor 215.

The trigger signal generator 201 generates a trigger signal (timing signal) of the same frequency as the operation frequency (for example, 400 kHz) of the bias power supply 20 (low-frequency side) at the same timing as the bias power supply 20, and provides the trigger signal to the frequency modulation amount/start phase controller 202. The frequency modulation amount/start phase controller 202 instructs the start phase setting section 204 and the modulation amount gain setting section 205 to set a start phase or a modulation amount gain (a value indicating a gain control ratio in a modulation range (for example, ±1.2 MHz)). The FM-modulated fundamental waveform table (memory) 203 is, for example, a table storing a waveform obtained by modulating a waveform in a range of 40.68 MHz±1.2 MHz at 400 kHz, and outputs an FM-modulated fundamental waveform in accordance with an instruction from the frequency modulation amount/start phase controller 202. The start phase setting section 204 sets a start phase of the FM-modulated fundamental waveform. The modulation amount gain setting section 205 sets a modulation amount gain of the FM-modulated fundamental waveform. The modulation table updating section 206 updates the value of the modulation amount gain and the value of the start phase in the FM modulation table that are currently being used for FM modulation.

The fundamental wave generator 207 generates a signal to be subjected to FM modulation, the signal comprising a fundamental wave (for example, 40.68 MHz) of the source power supply. The summing section (modulator) 208 performs FM modulation by reflecting the modulation amount gain and start phase from the modulation table updating section 206 on the fundamental wave from the fundamental wave generator 207 (for example, a waveform in the range of 49.68 MHz±1.2 MHz is FM modulated at 400 kHz). The DDS (Digital Direct Synthesizer) 209 A/D converts the FM-modulated signal and outputs it as a high-frequency signal. The amplifier 210 amplifies the high-frequency signal (FM-modulated signal) and provides a forward wave power Pf as an RF output to the matching device 30. In the following, the forward wave power Pf may be simply referred to as a forward wave Pf. Also, the voltage component of the forward wave power Pf may be referred to as a forward wave voltage. Similarly, a reflected wave power Pr reflected from the plasma load 40 side may be simply referred to as a reflected wave Pr. The voltage component of the reflected wave power Pr may be referred to as a reflected wave voltage.

The detector 211 detects the forward wave Pf corresponding to the Pf signal from the amplifier 210, and also detects the reflected wave Pr reflected from the plasma load 40 side via the matching device 30. The wide-band detector 212 detects the forward wave Pf and the reflected wave Pr for a predetermined number (a predetermined period), accumulates them, and outputs the forward wave Pf and the reflected wave Pr for the predetermined number to the averaging processor 213. The averaging processor 213 determines an average value (a moving average for each predetermined period) of each of the forward wave Pf and the reflected wave Pr for the predetermined number received from the wide-band detector 212, outputs the reflected wave Pr to the subtractor 215, and outputs the average value (moving average for each predetermined period) of each of the forward wave Pf and the reflected wave Pr to the frequency modulation amount/start phase controller 202.

The power setting section 214 outputs a target power setting value. The subtractor 215 calculate a deviation between the target power setting value and the detected forward wave Pf (an output value of the averaging processor 213), and outputs the deviation to the amplitude setting controller 216. The amplitude setting controller 216 sets an amplitude value for FM modulation based on the amount of deviation calculated by the subtractor 215.

The frequency modulation amount/start phase controller 202 causes the average values of the forward wave Pf and the reflected wave Pr (the moving averages for each predetermined period) that have been output from the averaging processor 213 to be stored in an internal memory (not illustrated). Further, the frequency modulation amount/start phase controller 202, if the reflected wave Pr has not been acquired with respect to all of previously set start phase setting values and modulation amount gain setting values, controls the start phase setting section 204 or the modulation amount gain setting section 205 to modify the start phase value or the modulation amount gain. In addition, the frequency modulation amount/start phase controller 202 determines a start phase setting value and a modulation amount gain setting value corresponding to a minimum reflected wave Pr among the reflected waves Pr corresponding to all the start phase setting values and modulation amount gain setting values, and fixes the subsequent FM modulation parameters (modulation amount gain setting value and start phase setting value).

<Details of Matching Process>

Figure 3A:
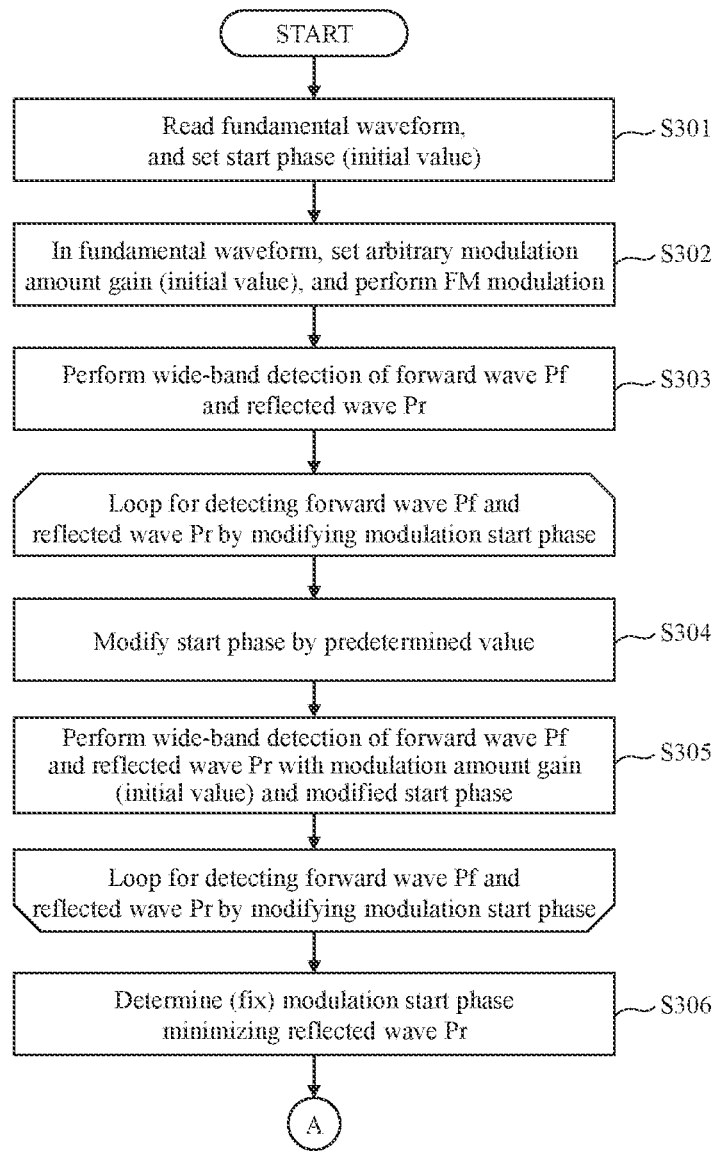
FIG. 3A is a flowchart (first half) for describing a matching process in the source power supply 10 according to the present embodiment.

FIG. 3A and FIG. 3B illustrate a flowchart for describing a matching process in the source power supply 10 according to the present embodiment.

(i) Step 301

The frequency modulation amount/start phase controller 202 receives from the trigger signal generator 201 a trigger signal (having the same frequency as the operation frequency (400 kHz) of the bias power supply 20: a timing signal), and instructs the start phase setting section 204 to set a start phase (initial value). In response to the instruction, the start phase setting section 204 reads from the FM-modulated fundamental waveform table 203 a fundamental waveform (for example, a waveform obtained by modulating a waveform in a range of 40.68 MHz±1.2 MHz with a frequency of 400 kHz), sets an arbitrary start phase (initial value), and outputs the fundamental waveform reflecting the start phase to the modulation amount gain setting section 205.

(ii) Step 302

In response to an instruction for setting a modulation amount gain from the frequency modulation amount/start phase controller 202, and upon reception of the fundamental waveform reflecting the start phase from the start phase setting section 204, the modulation amount gain setting section 205 sets an arbitrary modulation amount gain (initial value), and outputs a fundamental waveform reflecting the modulation amount gain to the modulation table updating section 206.

Then, the summing section (modulator) 208 performs FM modulation by reflecting an initial setting fundamental wave output from the modulation table updating section 206 on a fundamental wave output from the fundamental wave generator 207 (for example, the fundamental wave of 40.68 MHz in the source power supply 10), and provides an output to the DDS 209.

(iii) Step 303

The detector 211 detects the high-frequency output (the forward wave Pf: the output of the amplifier 210) that has been obtained by modulation with the modulation amount gain (initial value) and the start phase (initial value) and through amplification. The detector 211 also detects the reflected wave Pr from the plasma load 40 side. The detector 211 outputs the forward wave Pf and the reflected wave Pr to the wide-band detector 212. The wide-band detector 212 detects the forward wave Pf and the reflected wave Pr for a predetermined number of times of detection (or that have been detected in a predetermined period). Then, the averaging processor 213 calculates the moving average values.

(iv) Step 304

The frequency modulation amount/start phase controller 202 modifies the start phase from the previous value by a predetermined value (wherein the modifying step amount is determined in advance). At this time, the modulation amount gain is fixed to the same value as before, and the modulation table updating section 206 outputs the fundamental wave with the modified start phase to the summing section (modulator) 208. The summing section (modulator) 208 performs FM modulation by reflecting the fundamental wave (with the modified start phase) output from the modulation table updating section 206 on the fundamental wave output from the fundamental wave generator 207, and provides an output to the DDS 209.

(v) Step 305

The detector 211 detects the high-frequency output (the forward wave Pf: the output of the amplifier 210) that has been obtained by modulation of the fundamental wave with the modulation amount gain (initial value) and the modified start phase and through amplification. The detector 211 also detects the reflected wave Pr from the plasma load 40 side, and outputs the forward wave Pf and the reflected wave Pr to the wide-band detector 212. Then, the wide-band detector 212 detects the forward wave Pf and the reflected wave Pr for a predetermined number of times of detection (or that have been detected in a predetermined period). Then, the averaging processor 213 calculates the moving average values.

The processing of steps 304 and 305 is repeated in a prescribed range of start phases, and the reflected waves Pr corresponding to the start phases are detected. The detected reflected waves Pr are stored (accumulated) in internal memory (not illustrated) of the frequency modulation amount/start phase controller 202.

(vi) Step 306

The frequency modulation amount/start phase controller 202 extracts a minimum reflected wave Pr from a plurality of reflected waves Pr obtained by repeating steps 304 and 305, and acquires the value of the start phase corresponding thereto. In the subsequent processes, the frequency modulation amount/start phase controller 202 fixes the start phase to the acquired value.

While in the foregoing the minimum reflected wave Pr is extracted from a plurality of reflected waves Pr and the value of the start phase corresponding thereto is acquired, this is not a limitation. For example, a reflection coefficient Γ may be used. In this case, the reflection coefficient Γ may be calculated based on information about the forward wave Pf and the reflected wave Pr, the minimum reflection coefficient may be extracted from a plurality of reflection coefficients obtained by repeating steps 304 and 305, and the value of the start phase corresponding thereto may be acquired.

When the minimum value of the reflected wave Pr is extracted as described above, the forward wave Pf is not required when performing the processing in the frequency modulation amount/start phase controller 202.

When the minimum value of the reflection coefficient Γ is extracted, the frequency modulation amount/start phase controller 202 will have the functionality to calculate the reflection coefficient. In this embodiment, the reflection coefficient Γ is calculated according to Expression (1):

$$\Gamma = \sqrt{(Pr/Pf)} \qquad (1)$$

Whether the minimum value of the reflected wave Pr is extracted or the minimum value of the reflection coefficient Γ is extracted, the concept of extracting the minimum value of the reflected wave Pr is the same.

The reflection coefficient may be calculated based on the forward wave voltage and the reflected wave voltage, or may be calculated according to another scheme. The detector 211 may be any detector capable of detecting desired information.

(vii) Step 307

The frequency modulation amount/start phase controller 202 modifies the modulation amount gain from the previous value by a predetermined value (wherein the modifying step amount is determined in advance). At this time, the value of the start phase is fixed to the value determined in step 306. The modulation table updating section 206 outputs a fundamental wave having the fixed value of start phase and the modified modulation amount gain to the summing section (modulator) 208. The summing section (modulator) 208 performs FM modulation by reflecting the fundamental wave (having the fixed start phase and the modified modulation amount gain) output from the modulation table updating section 206 on the fundamental wave output from the fundamental wave generator 207, and provides an output to the DDS 209.

(viii) Step 308

The detector 211 detects the high-frequency output (forward wave Pf: the output of the amplifier 210) that has been obtained by modulation of the fundamental wave with the fixed start phase and the modified modulation amount gain and through amplification. The detector 211 also detects the reflected wave Pr from the matching device 30, and then outputs the forward wave Pf and the reflected wave Pr to the wide-band detector 212. The wide-band detector 212 detects the forward wave Pf and the reflected wave Pr for a predetermined number of times of detection (or that have been detected in a predetermined period). The averaging processor 213 calculates the moving average values.

The processing of steps 307 and 308 is repeated within a prescribed range of start phases, and the reflected waves Pr corresponding thereto are detected. The detected reflected waves Pr are stored (accumulated) in an internal memory (not illustrated) of the frequency modulation amount/start phase controller 202.

(ix) Step 309

The frequency modulation amount/start phase controller 202 extracts a minimum reflected wave Pr from a plurality of reflected waves Pr obtained by repeating steps 307 and 308, and acquires the value of the modulation amount gain corresponding thereto. The frequency modulation amount/start phase controller 202 then uses the start phase obtained in step 306 and the modulation amount gain obtained in step 309 for the subsequent modulating operation (completion of matching).

In the foregoing, the minimum reflected wave Pr is extracted from a plurality of reflected waves Pr, and the value of the start phase corresponding to the minimum reflected wave Pr is acquired. However, this is not a limitation, and a reflection coefficient may be used, as in step 306. In this case, as described in step 306, the information about the forward wave Pf is not required in the frequency modulation amount/start phase controller 202.

<Changes in Forward Wave Pf and Reflected Wave Pr before Completion of Matching>

FIGS. 4A, 4B and 4C illustrate changes in the forward wave Pf and the reflected wave Pr from the start of the modulating operation to completion of matching. FIG. 4A illustrates the forward wave Pf and the reflected wave Pr at the start of the modulating operation, and a modulation setting condition (sweeping of modulation start phase). FIG. 4B illustrates the forward wave Pf and the reflected wave Pr when the value of the modulation start phase is fixed to a value minimizing the reflected wave Pr, and a modulation setting condition (sweeping of the modulation amount gain). FIG. 4C illustrates the forward wave Pf and the reflected wave Pr at completion of matching, and the value of the modulation start phase and the value of the modulation amount gain after completion of matching.

As illustrated in FIG. 4A, at the start of modulating operation, when the modulation start phase and the modulation amount gain are not their optimum values, the detected reflected wave Pr increases. To suppress the reflected wave Pr, the matching operation (determining the optimum values of the modulation start phase and the modulation amount gain) is necessary. Thus, initially, in order to determine the optimum modulation start phase as described above, the modulation amount gain is fixed and the modulation start phase is varied (swept). Then, the value of the modulation start phase that minimizes the reflected wave Pr (reflection coefficient) is determined.

Then, as illustrated in FIG. 4B, the value of the modulation start phase is fixed to the value (the value determined in FIG. 4A) minimizing the reflected wave Pr (reflection coefficient), and the modulation amount gain is varied (swept) from the initial value (arbitrary modulation amount gain). Then, a value of the modulation amount gain that minimizes the reflected wave Pr (reflection coefficient) is determined.

Thus, when the value of the modulation start phase and the value of the modulation amount gain that minimize the reflected wave Pr (reflection coefficient) are acquired, matching is completed. As illustrated in FIG. 4C, it will be seen that the reflected wave Pr upon completion of matching is suppressed compared to the reflected wave Pr prior to the matching process.

Thereafter, the source power supply 10 performs FM modulation of the high-frequency output with the modulation start phase θ (Γmin) and the modulation amount gain A (Γmin) that have been determined, and provides the FM-modulated high-frequency output (RF output) to the matching device 30. While in the foregoing description an optimum modulation start phase is determined first and then an optimum modulation amount gain is determined, the order of determination may be reversed.

CONCLUSION (i) According to the present embodiment, in the source power supply 10, the frequency modulation amount/start phase controller 202, in response to a trigger signal having the same frequency as the operation frequency (first frequency: 400 kHz) of the bias power supply and serving as an FM modulation timing signal, detects a reflected wave while varying the modulation start phase and the modulation amount gain, and determines an optimum modulation start phase and an optimum modulation amount gain that minimize the reflected wave. In this way, the matching operation can be completed by simply controlling the values of the modulation start phase and the modulation amount gain. This makes it possible to significantly reduce the number of processes in the matching operation.

More specifically, the source power supply 10 first detects a reflected wave while sweeping the modulation start phase with the modulation amount gain fixed to an arbitrary value, and then determines an optimum modulation start phase that minimizes the reflected wave. Then, the source power supply detects a reflected wave while sweeping the modulation amount gain with the modulation start phase fixed to the optimum modulation start phase, and determines an optimum modulation amount gain that minimizes the reflected wave. While one of the optimum modulation start phase and the optimum modulation amount gain may be determined first, it may be possible to perform the matching process more efficiently if the optimum modulation start phase is determined first and then the optimum modulation amount gain is determined.

In addition, in the present embodiment, when the matching process is performed, a moving average value (for a predetermined number of times or in a predetermined period) of each of the forward wave Pf and the reflected wave Pr is used. In this way, any sharp change in the reflected wave Pr can be smoothed. Thus, the matching operation can be performed more accurately.

Further, the source power supply 10 includes a trigger signal generator 201 for generating the trigger signal. Thus, it is not necessary to acquire the trigger signal of 400 kHz from the bias power supply separately. This makes it possible to ensure the independence of the source power supply 10 and the bias power supply 20.

Moreover, the source power supply 10 includes the FM-modulated fundamental waveform table 203 of the first frequency (400 kHz). The source power supply 10 modifies the modulation start phase and the modulation amount gain of a waveform read from the FM-modulated fundamental waveform table 203 to an optimum modulation start phase and an optimum modulation amount gain, and performs frequency modulation by applying the waveform to the fundamental waveform of the second frequency (40.68 MHz). In this way, it is possible to perform FM modulation (where the FM modulation frequency is the first frequency (400 kHz)) by simply modifying the modulation start phase and the modulation amount gain in the first-frequency modulation table. Accordingly, it is possible to reduce the number of processes in the matching operation.

(ii) The functions of the present embodiment may be implemented using a software program code. In this case, a storage medium having a program code recorded thereon may be supplied to a system or a device, and the program code stored on the storage medium may be read by a computer (or a CPU or an MPU) of the system or device. In this case, the program code per se read from the storage medium will implement the above-described functions of the embodiment, and the program code per se and the storage medium having the same stored thereon will constitute the present disclosure. Examples of the storage medium for supplying such program code may include a flexible disc, a CD-ROM, a DVD-ROM, a hard disk, an optical disk, a magneto-optical disk, a CD-R, magnetic tape, a non-volatile memory card, and a ROM.

In accordance with an instruction of the program code, some or all of the actual processing may be performed by an operating system (OS) or the like running on the computer to implement the above-described functions of the embodiment. Further, after the program code read from the storage medium is written to a memory on the computer, some or all of the actual processing may be performed by a CPU or the like of the computer based on an instruction of the program code, and the above-described functions of the embodiment may be implemented by the processing.

In addition, a software program code for implementing the functions of an embodiment may be distributed via a network and stored in a storage means of a system or a device, such as a hard disk or a memory, or in a storage medium such as a CD-RW or a CD-R. Then, in operation, the program code stored in the storage means or the storage medium may be read and executed by the computer (or a CPU or an MPU) of the system or device.

The processes and techniques discussed herein are not inherently related to any specific device. Various types of general-purpose devices may be used in accordance with the description of the present disclosure. It may prove convenient to construct a specialized device to perform the techniques of the present disclosure.

Various embodiments may be formed by appropriate combinations of a plurality of components disclosed in the present embodiment. For example, some of the components indicated in the present embodiment may be deleted. Further, components from across different embodiments may be combined as appropriate. While the techniques of the present disclosure have been described in terms of specific embodiments, these are illustrative and exemplary, and are not intended to be restrictive of the techniques of the present disclosure. Those skilled in the art will appreciate that a large number of combinations of hardware, software, and firmware suitable for implementing the techniques of the present disclosure exist. For example, the software discussed herein may be implemented in a wide range of programming or script languages, such as assembler, C/C++, Perl, Shell, PHP, and Java®.

Further, in the above-described embodiment, only those control lines and information lines that are considered necessary for the purposes of explanation are shown, and not every control line or information line found in a product is necessarily shown. All features may be interconnected.

What is claimed is:

1. A high-frequency power supply system for providing a high-frequency power to a connected load, the high-frequency power supply system comprising:
   a bias power supply for supplying a bias power at a first frequency;
   a source power supply for supplying a high-frequency output of a second frequency higher than the first frequency, the high-frequency output being frequency modulated with the first frequency; and
   a matching device including an impedance matching circuit for acquiring the bias power and the frequency modulated high-frequency output and achieving matching between an impedance on the source power supply side and an impedance on the load side,
   wherein the source power supply, in response to a trigger signal for timing having the same frequency as the first frequency, detects a reflected wave while causing each of a modulation start phase and a modulation amount gain to be varied, and determines an optimum modulation start phase and an optimum modulation amount gain that minimize the reflected wave.

2. The high-frequency power supply system according to claim 1, wherein the source power supply:
   detects the reflected wave while sweeping the modulation start phase with the modulation amount gain fixed to an arbitrary value, and determines the optimum modulation start phase that minimizes the reflected wave; and
   detects the reflected wave while sweeping the modulation amount gain with the modulation start phase fixed to the optimum modulation start phase, and determines the optimum modulation amount gain that minimizes the reflected wave.

3. The high-frequency power supply system according to claim 1, wherein the source power supply detects a forward wave and the reflected wave, calculates a moving average value of each of the forward wave and the reflected wave that have been detected, and determines the optimum modulation start phase and the optimum modulation amount gain that minimize the moving average value of the reflected wave.

4. The high-frequency power supply system according to claim 2, wherein the source power supply detects a forward wave and the reflected wave, calculates a moving average value of each of the forward wave and the reflected wave that have been detected, and determines the optimum modulation start phase and the optimum modulation amount gain that minimize the moving average value of the reflected wave.

5. The high-frequency power supply system according to claim 1, wherein the source power supply includes a trigger signal generator for generating the trigger signal.

6. The high-frequency power supply system according to claim 1, wherein the source power supply includes a modulation table of the first frequency, modifies a modulation start phase and a modulation amount gain of a waveform read from the modulation table to the optimum modulation start phase and the optimum modulation amount gain, and applies the waveform to a fundamental waveform of the second frequency to perform frequency modulation.

\* \* \* \* \*